United States Patent
Koide et al.

(10) Patent No.: US 10,453,729 B2
(45) Date of Patent: Oct. 22, 2019

(54) SUBSTRATE TREATMENT APPARATUS AND SUBSTRATE TREATMENT METHOD

(71) Applicant: TOSHIBA MEMORY CORPORATION, Minato-ku (JP)

(72) Inventors: Tatsuhiko Koide, Kuwana (JP); Hiroyasu Iimori, Mie (JP); Shinsuke Kimura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/915,559

(22) Filed: Mar. 8, 2018

(65) Prior Publication Data
US 2019/0080947 A1  Mar. 14, 2019

(30) Foreign Application Priority Data
Sep. 13, 2017 (JP) .................. 2017-176061

(51) Int. Cl.
| | |
|---|---|
| H01L 21/68 | (2006.01) |
| H01L 21/673 | (2006.01) |
| H01L 21/02 | (2006.01) |
| H01L 21/67 | (2006.01) |
| H01L 21/677 | (2006.01) |

(52) U.S. Cl.
CPC ........ H01L 21/68 (2013.01); H01L 21/02348 (2013.01); H01L 21/67028 (2013.01); H01L 21/67051 (2013.01); H01L 21/6776 (2013.01); H01L 21/67115 (2013.01); H01L 21/67379 (2013.01); H01L 21/67383 (2013.01); H01L 21/67706 (2013.01)

(58) Field of Classification Search
CPC .............. H01L 21/68; H01L 21/02348; H01L 21/67051; H01L 21/67379; H01L 21/67706
See application file for complete search history.

(56) References Cited

U.S. PATENT DOCUMENTS

| | | |
|---|---|---|
| 7,438,760 B2 | 10/2008 | Bauer et al. |
| 7,687,383 B2 | 3/2010 | Bauer et al. |
| 7,749,909 B2 | 7/2010 | Tomita et al. |
| 7,816,236 B2 | 10/2010 | Bauer et al. |

(Continued)

FOREIGN PATENT DOCUMENTS

| | | |
|---|---|---|
| JP | 01-149423 | 6/1989 |
| JP | 2008-530782 | 8/2008 |

(Continued)

*Primary Examiner* — Zandra V Smith
*Assistant Examiner* — Andre C Stevenson
(74) *Attorney, Agent, or Firm* — Oblon, McClelland, Maier & Neustadt, L.L.P.

(57) ABSTRACT

According to an embodiment, a substrate treatment apparatus includes a support unit, a silane coupler supplier, an organic functional group remover, and a drive mechanism. The support supports a substrate having a patterned film. The silane coupler supplier supplies the film with a silane coupler. The organic functional group remover removes an organic functional group from the film silylated with the silane coupler. The drive mechanism drives at least one of the support, the silane coupler supplier, and the organic functional group remover in such a way that the supply of the silane coupler and the supply of light or gas are repeated by a predetermined number.

12 Claims, 5 Drawing Sheets

(56) References Cited

U.S. PATENT DOCUMENTS

| | | | |
|---|---|---|---|
| 7,838,425 | B2 | 11/2010 | Tomita et al. |
| 7,985,683 | B2 | 7/2011 | Tomita et al. |
| 9,666,694 | B2 | 5/2017 | Nishitani et al. |
| 2010/0006538 | A1* | 1/2010 | Asuke ............... G02F 1/133719 216/23 |
| 2014/0357016 | A1 | 12/2014 | Fuse et al. |
| 2018/0087836 | A1* | 3/2018 | Yoshihara ................. F26B 9/10 |

FOREIGN PATENT DOCUMENTS

| | | |
|---|---|---|
| JP | 2010-114414 | 5/2010 |
| JP | 2010-114440 | 5/2010 |
| JP | 2010-114467 | 5/2010 |
| JP | 2011-114439 | 5/2010 |
| JP | 2012-178606 | 9/2012 |
| JP | 2014-236148 | 12/2014 |
| JP | 2015-019102 | 1/2015 |
| JP | 2015-088732 | 5/2015 |
| JP | 2015-132007 | 7/2015 |
| JP | 2016-001753 | 1/2016 |
| JP | 2016-066811 | 4/2016 |

\* cited by examiner

SUBSTRATE TREATMENT APPARATUS AND SUBSTRATE TREATMENT METHOD

CROSS-REFERENCE TO RELATED APPLICATIONS

This application is based upon and claims the benefit of priority from Japanese Patent Application No. 2017-176061, filed on Sep. 13, 2017; the entire contents of which are incorporated herein by reference.

FIELD

Embodiments of the present invention relate to a substrate treatment apparatus and a substrate treatment method.

BACKGROUND

When a patterned film is formed on a substrate, a portion of the film is removed more than necessary or becomes narrower than the other portion in some cases. In such cases, the shape of the film can be corrected by adding a film to the portion.

However, for example, in a case where many kinds of films have been formed on the substrate, it is difficult to selectively add a film to a specific type of film. Further, in a case where films have been formed at a plurality of locations, it is difficult to selectively add a film to a film located at a specific location.

Embodiments of the present invention provide a substrate treatment apparatus and a substrate treatment method capable of selectively adding a film to a substrate having a film thereon.

DETAILED DESCRIPTION

Embodiments will now be explained with reference to the accompanying drawings. The present invention is not limited to the embodiments.

First Embodiment

Figure 1:
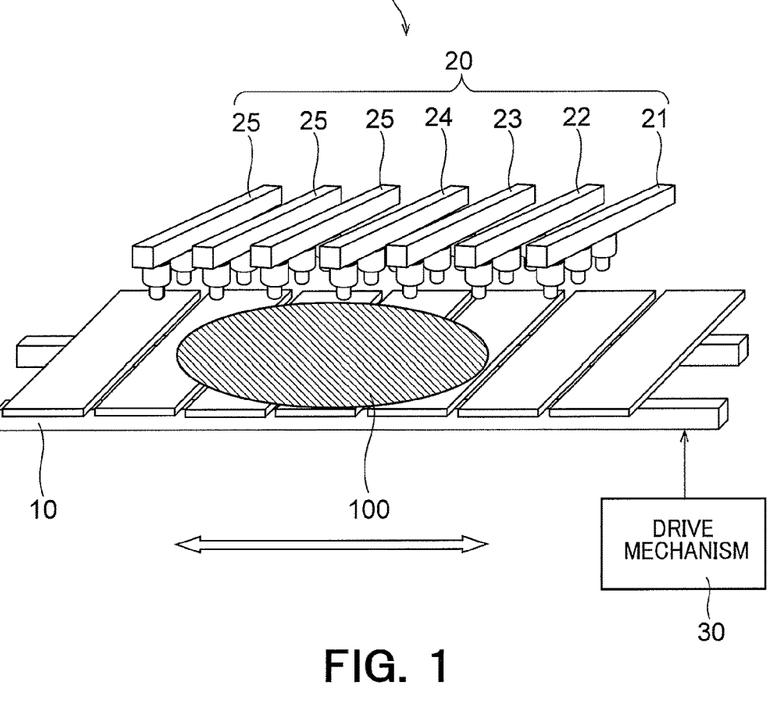
FIG. 1 shows a schematic configuration of a substrate treatment apparatus according to a first embodiment.

FIG. 1 shows a schematic configuration of a substrate treatment apparatus according to a first embodiment. A substrate treatment apparatus 1 according to the present embodiment includes a support unit 10, a film depositor 20, and a drive mechanism 30, as shown in FIG. 1.

The support unit 10 is configured in the form of belts so driven by the drive mechanism 30 as to make horizontal reciprocation relative to the film depositor 20. A substrate 100 is supported on the support unit 10. The positional relationship between the substrate 100 and the film depositor 20 changes as the support unit 10 makes the reciprocation. In the present embodiment, the substrate 100 is a wafer-shaped silicon substrate.

Figure 2:
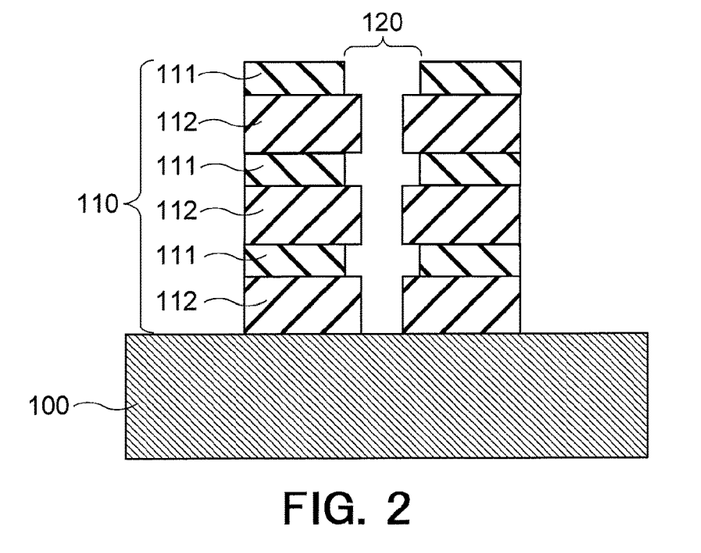
FIG. 2 is a cross-sectional view showing the structure of a substrate according to the first embodiment.

FIG. 2 is a cross-sectional view showing the structure of the substrate 100 according to the present embodiment. A laminate 110 is formed on the substrate 100, as shown in FIG. 2. The laminate 110 is formed of silicon oxide films ($SiO_2$) 111 and silicon nitride films (SiN) 112 alternately layered on each other. A hole 120 is formed through the laminate 110. In a case where the laminate 110 is used, for example, as a three-dimensional semiconductor memory, the silicon oxide films 111 or the silicon nitride films 112 are replaced with electrode films, and a functional film for holding electrons is formed in the hole 120. The structure of the laminate 110 is not limited to the structure shown in FIG. 2. For example, the laminate 110 may have a structure including metal films in place of the silicon nitride films 112.

When the hole 120 is processed, for example, in an etching process so as to pass through the laminate 110, the silicon oxide films 111 are etched away by a greater amount than the silicon nitride films 112 in some cases, as shown in FIG. 2. In such cases, in the hole 120, the opening width of the silicon oxide films 111 is wider than the opening width of the silicon nitride films 112. The difference in the size of the opening width described above may affect the electrical characteristics of the semiconductor memory described above.

Then, the substrate treatment apparatus 1 according to the present embodiment includes the film depositor 20 for adding a film to each of the silicon oxide films 111. The film depositor 20 includes nozzles 21 to 25 arranged along the support unit 10, as shown in FIG. 1.

The nozzle 21 is located at one end of the nozzle row. The nozzle 21 supplies a rinse liquid. The rinse liquid includes, for example, isopropyl alcohol (IPA).

The nozzle 22 (silane coupler supplier) is adjacent to the nozzle 21. The nozzle 22 supplies a silane coupler. The silane coupler is, for example, a liquid formed of molecules each having a hydrolyzable group having affinity for and reactivity to an inorganic material and an organic functional group that chemically bonds to an organic material. Specifically, the silane coupler is a liquid including hexamethyldisilazane (HMDS), trimethylsilyldiethylamine (TMS-DEA), trimethylsilyldimethylamine (TMSDMA), or any other substance.

The nozzle 23 (rinse liquid supplier) is adjacent to the nozzle 22. The nozzle 23 also supplies a rinse liquid including, for example, isopropyl alcohol, as the nozzle 21 does.

The nozzle 24 (dry gas supplier) is adjacent to the nozzle 23. The nozzle 24 supplies a dry gas. The dry gas is, for example, dry air or a nitrogen ($N_2$) gas. In the present embodiment, dry air having a dew point of about −60° C. is used.

The nozzles 25 (organic functional group removers) are adjacent to the nozzle 24 and located at the other end of the nozzle row. The nozzles 25 each supplies ultraviolet light or ozone ($O_3$). In the present embodiment, three nozzles 25 are arranged, but the number of nozzles 25 is not limited to a specific number.

Figure 3:
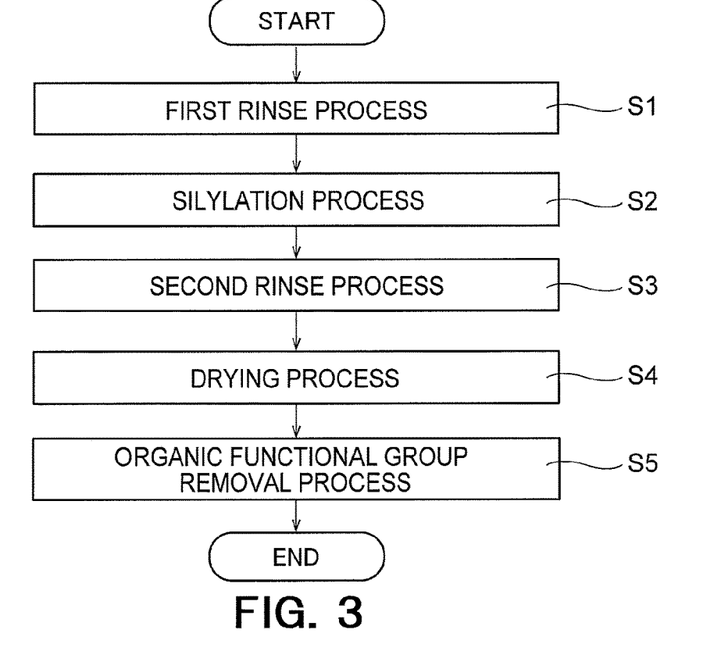
FIG. 3 is a flowchart showing a substrate treatment method according to the first embodiment.

A substrate treatment method according to the present embodiment will be described below with reference to FIGS. 3 and 4A to 4D. FIG. 3 is a flowchart showing the substrate treatment method according to the present embodiment. FIGS. 4A to 4D are diagrammatic views showing how a film is added to each of the silicon oxide films 111.

A first rinse process (step S1) is first carried out, as shown in FIG. 3. In the first rinse process, the nozzle 21 supplies the rinse liquid onto the substrate 100. Substances left on the substrate 100 in a process carried out before the first rinse process are therefore washed away. The drive mechanism 30 then linearly moves the support unit 10 to move the substrate 100 to the position where the substrate 100 faces the nozzle 22.

Figure 4A:
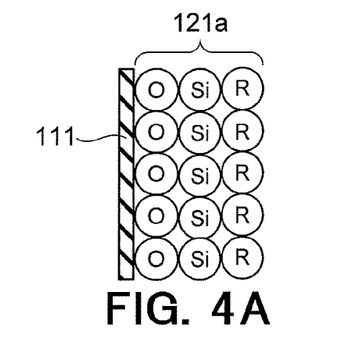
FIG. 4A is a diagrammatic view showing how a film is added to a silicon oxide film.

A silylation process (step S2) is then carried out. In the silylation process, the nozzle 22 supplied the silane coupler onto the substrate 100. The silane coupler flows on the upper surface of the laminate 110 and flows into the hole 120. The silane coupler thus chemically reacts with the silicon oxide films 111. As a result, a silylated film 121a formed of oxygen ($O_2$), silicon (Si), and an organic functional group (R) is formed on the surface of each of the silicon oxide films 111 that is exposed to the interior of the hole 120, as shown in FIG. 4A. The drive mechanism 30 then linearly moves the support unit 10 to move the substrate 100 to the position where the substrate 100 faces the nozzle 23.

A second rinse process (step S3) is then carried out. In the second rinse process, the nozzle 23 supplies the rinse liquid onto the substrate 100. The silane coupler that has not reacted in the silylation process described above is therefore replaced with the alcohol and washed away. The drive mechanism 30 then linearly moves the support unit 10 to move the substrate 100 to the position where the substrate 100 faces the nozzle 24.

A drying process (step S4) is then carried out. In the drying process, the nozzle 24 radiates the dry gas onto the substrate 100. The surfaces of the silylated films 121a are therefore dried. The drive mechanism 30 then linearly moves the support unit 10 to move the substrate 100 to the position where the substrate 100 faces the nozzles 25.

Figure 4B:
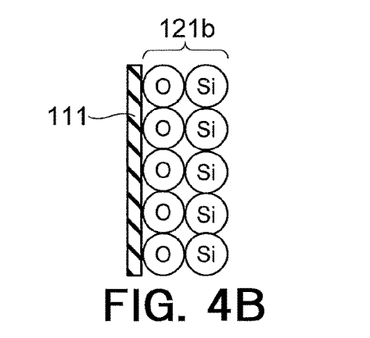
FIG. 4B is a diagrammatic view showing how the film is added to the silicon oxide film.

An organic functional group removal process (step S5) is then carried out. In the organic functional group removal process, the nozzles 25 radiate ultraviolet light or ozone onto the substrate 100. As a result, a silicon oxide films 121b, which is the silylated film 121a from which the organic functional group is removed, is formed, as shown in FIG. 4B.

In the present embodiment, the number of nozzles 25 is greater than the number of nozzles 22. The nozzles 25 radiate ultraviolet light or ozone onto the substrate 100. The period for the process using the nozzles 25 is therefore longer than the period for the process using the nozzle 22, which supplies the silane coupler in the form of liquid. Increasing the number of nozzles 25 therefore allows an increase in the area irradiated with the ultraviolet light or ozone, whereby the processing period can be shortened.

When the organic functional group removal process is completed, the drive mechanism 30 then linearly moves the support unit 10 in the opposite direction to move the substrate 100 back to the position where the substrate 100 faces the nozzle 21. The processes in steps S1 to S5 described above are then carried out again. The drive mechanism 30 may instead be configured in the form of annular rails, and the support unit 10 may go around along the rails.

Figure 4C:
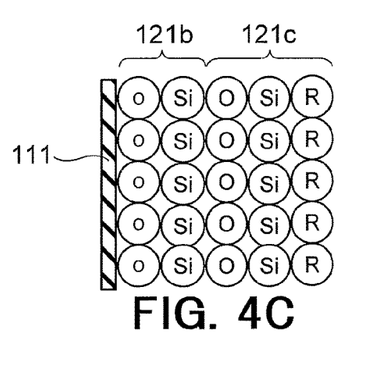
FIG. 4C is a diagrammatic view showing how the film is added to the silicon oxide film.
Figure 4D:
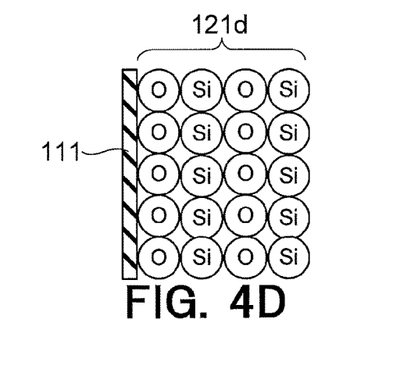
FIG. 4D is a diagrammatic view showing how the film is added to the silicon oxide film.

In the second silylation process (step S2), a silylated film 121c is formed on the silicon oxide film 121b, as shown in FIG. 4C. In the second organic functional group removal process (step S5), a silicon oxide film 121d thicker than the silicon oxide film 121b is formed, as shown in FIG. 4D. The film is thus added to each of the silicon oxide films 111.

The processes in steps S1 to S5 described above are then repeated until the thickness of the film being added reaches a predetermined value. If the repetition number of the processes reaches an upper limit, the drive mechanism 30 stops driving the support unit 10. The upper limit may not be a fixed value but may instead be changed as appropriate in consideration of the past film addition history or any other factor. In this case, the film can be appropriately added in accordance with the situation of the apparatus.

Figure 5A:
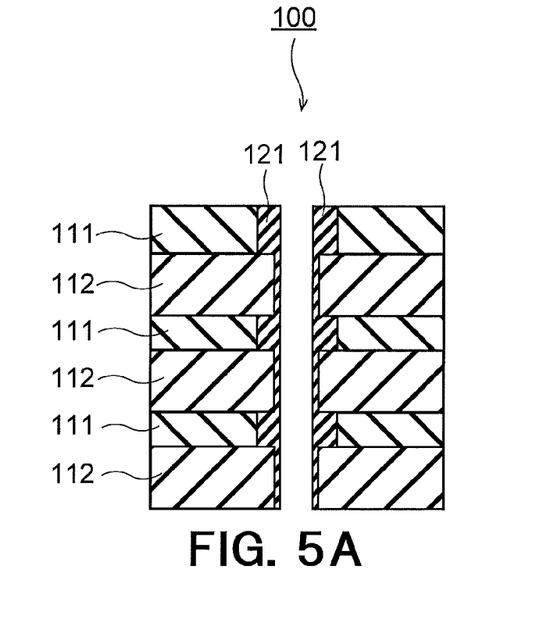
FIG. 5A is a cross-sectional view of a substrate before a DHF process.
Figure 5B:
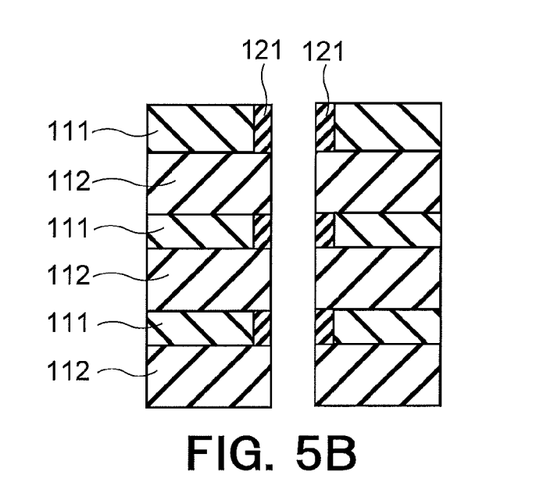
FIG. 5B is a cross-sectional view of the substrate after the DHF process.

In the present embodiment, the silicon oxide films 121 are selectively deposited on the silicon oxide films 111, but the amount of deposition of the silicon oxide films 121 on the silicon nitride films 112 is not zero. Part of the silicon oxide films 121 is therefore deposited on the silicon nitride films 112, as shown in FIG. 5A. It is therefore desirable to remove the silicon oxide films 121 deposited on the silicon nitride films 112, as shown in FIG. 5B. A method for removing the silicon oxide films 121 is, for example, a DHF process using dilute hydrofluoric acid.

According to the present embodiment described above, repeating the supply of the silane coupler and the radiation of ultraviolet light or ozone allows selective deposition of the silicon oxide films 121 on the surfaces of the silicon oxide films 111. The substrate 100 having two types of film thereon, the silicon oxide films 111 and the silicon nitride films 112, can therefore be processed so that a film is selectively added to each of the silicon oxide films 111.

Further, in the present embodiment, when the number of silicon oxide films 111 and silicon nitride films 112 to be layered on each other is greater for an increase in the capacity of the semiconductor memory, the hole 120 becomes deeper. In this case, for example, when a silane-coupler-including gas is used, the gas does not reach the bottom of the hole 120, and a loading effect could therefore occur between the upper portion and the lower portion of the laminate 110.

In the present embodiment, however, the liquid silane coupler is used. The silane coupler therefore adequately reaches the bottom of the hole 120, whereby the loading effect described above can be avoided.

In the present embodiment, the drive mechanism 30 drives the support unit 10 in the process in each of the steps described above. The drive mechanism 30 may instead cause the nozzles 21 to 25 described above to make horizontal reciprocation in place of the support unit 10. Also in this case, the positional relationship between each of the nozzles and the substrate 100 changes, and the processes can be carried out.

Second Embodiment

Figure 6:
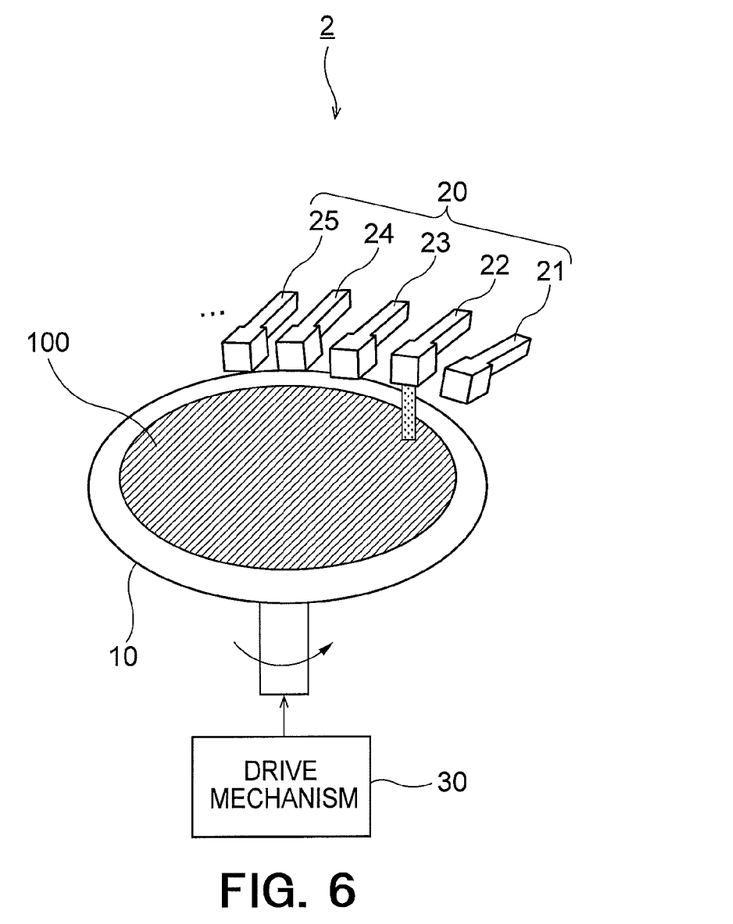
FIG. 6 shows a schematic configuration of a substrate treatment apparatus according to a second embodiment.

FIG. 6 shows a schematic configuration of a substrate treatment apparatus according to a second embodiment. The same configurations as those of the substrate treatment apparatus 1 according to the first embodiment described above have the same reference characters and will not be described in detail.

A substrate treatment apparatus 2 according to the present embodiment includes a support unit 10, a film depositor 20, and a drive mechanism 30, as shown in FIG. 6, as the substrate treatment apparatus 1 does. In the present embodiment, however, the support unit 10 is configured in the form of a table rotationally moved by the drive mechanism 30. A substrate 100 placed on the support unit 10 also rotates when the support unit 10 rotates.

Figure 7:
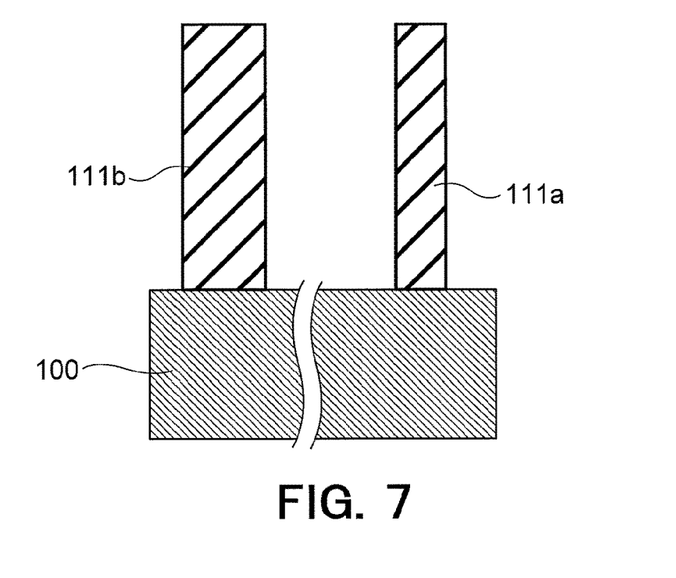
FIG. 7 is a cross-sectional view showing the structure of a substrate according to the second embodiment.

FIG. 7 shows the structure of the substrate 100 according to the present embodiment. A patterned silicon oxide film is formed on the substrate 100, as shown in FIG. 7. The silicon oxide film is patterned so that a columnar silicon oxide film 111a, which is located in an outer peripheral portion of the substrate 100, is narrower than a columnar silicon oxide film 111b, which is located in a central portion of the substrate 100. In this case, to correct the difference in the dimension between the silicon oxide film 111a and the silicon oxide film 111b, or to prevent collapse of the silicon oxide film 111a, it is desirable to add a film to the silicon oxide film 111a.

Then, the substrate treatment apparatus 2 according to the present embodiment includes the film depositor 20 for adding a film to the silicon oxide film 111a. The film depositor 20 includes the nozzles 21 to 25, as in the first embodiment.

A substrate treatment method according to the present embodiment will be described below. The substrate processing in the present embodiment is also performed in accordance with the flowchart shown in FIG. 3, as in the first embodiment.

In the first rinse process (step S1) and the second rinse process (step S3), the nozzle 21 ejects the rinse liquid while the drive mechanism 30 rotates the support unit 10. The outer peripheral portion of the substrate 100 is therefore washed with the rinse liquid.

In the silylation process (step S2), the nozzle 22 ejects the silane coupler while the drive mechanism 30 rotates the support unit 10. The silane coupler is therefore supplied to the outer peripheral portion of the substrate 100, and a silylated film is formed on the surface of the silicon oxide film 111a. In this process, since no silane coupler is supplied to the central portion of the substrate 100, the silylated film described above is not formed on the surface of the silicon oxide film 111b.

In the drying process (step S4), the nozzle 24 radiates the dry gas while the drive mechanism 30 rotates the support unit 10. The surface of the silylated film described above is therefore dried.

In the organic functional group removal process (step S5), the nozzles 25 radiate ultraviolet light or ozone onto the substrate 100 while the drive mechanism 30 rotates the support unit 10. As a result, a silicon oxide film that is the silylated film described above from which the organic functional group is removed is formed. In the case where ultraviolet light is radiated in step S5, an ultraviolet light radiator is not limited to the nozzles 25. For example, a stationary ultraviolet lamp capable of radiating ultraviolet light onto the entire substrate 100 may be used. In this case, the radiation area increases, whereby the processing efficiency is improved.

Figure 8:
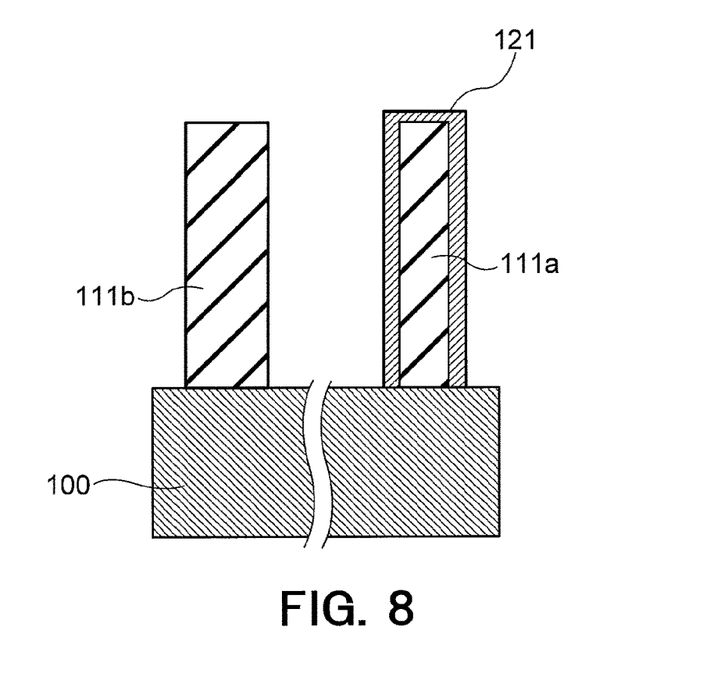
FIG. 8 is a cross-sectional view showing the structure of the substrate shown in FIG. 7 after a film is added thereto.

The processes in steps S1 to S5 described above are then repeated by a predetermined number. As a result, the silicon oxide film 121 is selectively added to the silicon oxide film 111a, as shown in FIG. 8.

According to the present embodiment described above, repeating the supply of the silane coupler and the radiation of ultraviolet light or ozone during the rotation of the substrate 100 allows selective deposition of the silicon oxide film 121 on the silicon oxide film 111a located in the outer peripheral portion of the substrate 100. The film can therefore be added at a specific location, that is, the outer peripheral portion of the substrate 100. Further, the amount of film deposition can be controlled both in an inner central portion and an outer peripheral portion of the substrate 100 (wafer).

To add films both in the inner central portion and the outer peripheral portion of the substrate 100, another film depositor 20 is disposed in a position corresponding to the center of the substrate 100 (wafer). The film deposition in the laminate 110 described in the first embodiment can also be performed.

Further, in a case where no film compensation is necessary in the inner central portion and the outer peripheral portion of the substrate 100, the processing shown in FIG. 7 can be performed by using the method in the first embodiment shown in FIG. 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
   a support unit to support a substrate having a patterned film;
   a silane coupler supplier to supply the film with a silane coupler;
   an organic functional group remover to supply light or gas that removes an organic functional group from the film silylated with the silane coupler; and
   a drive mechanism to drive at least one of the support, the silane coupler supplier, and the organic functional group remover in such a way that the supply of the silane coupler and the supply of the light or the gas are repeated by a predetermined number, wherein
   the support unit is configured in a form of a belt,
   the drive mechanism linearly reciprocates the support unit in a horizontal direction, and
   the silane coupler supplier, the rinse liquid supplier, the dry gas supplier, and the organic functional group remover are arranged along a direction in which the support unit moves.

2. The substrate treatment apparatus according to claim 1, wherein the silane coupler is liquid.

3. The substrate treatment apparatus according to claim 1, wherein the light is ultraviolet light, or the gas is ozone.

4. The substrate treatment apparatus according to claim 1, wherein the number of organic functional group removers is greater than that of silane coupler suppliers.

5. The substrate treatment apparatus according to claim 1, further comprising:
   a rinse liquid supplier to supply a rinse liquid that rinses away the silane coupler after the silane coupler is supplied; and
   a dry gas supplier to supply a dry gas after the rinse liquid is supplied.

6. The substrate treatment apparatus according to claim 1, wherein the film includes at least a silicon oxide film.

7. The substrate treatment apparatus according to claim 1, wherein the coupler agent supplier, the rinse liquid supplier, the dry gas supplier, and the organic functional group remover are each a nozzle.

8. A substrate treatment method comprising:
  supplying a substrate having a pattered film with a silane coupler;
  supplying light or gas that removes an organic functional group from the film silylated with the silane coupler; and
  repeating the supply of the silane coupler and the supply of the light or the gas by a predetermined number by linearly reciprocating the substrate in a horizontal direction.

9. The substrate treatment method according to claim 8, wherein the silane coupler is liquid.

10. The substrate treatment method according to claim 8, wherein the light is ultraviolet light, or the gas is ozone.

11. The substrate treatment method according to claim 8, wherein
  the silane coupler is rinsed away after the silane coupler is supplied, and
  a dry gas is supplied after the rinse liquid is supplied.

12. The substrate treatment method according to claim 8, wherein the film includes at least a silicon oxide film.

* * * * *